(12) United States Patent
Patel et al.

(10) Patent No.: US 11,750,973 B2
(45) Date of Patent: Sep. 5, 2023

(54) MICROELECTROMECHANICAL SYSTEM

(71) Applicant: AAC ACOUSTIC TECHNOLOGIES (SHENZHEN) CO., LTD., Shenzhen (CN)

(72) Inventors: Anup Patel, Eb (GB); Euan James Boyd, Eb (GB); Scott Lyall Cargill, Eb (GB)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 366 days.

(21) Appl. No.: 17/168,192

(22) Filed: Feb. 5, 2021

(65) Prior Publication Data
US 2022/0256284 A1    Aug. 11, 2022

(51) Int. Cl.
  *H04R 25/00* (2006.01)
  *H04R 3/02* (2006.01)
  *B81B 3/00* (2006.01)

(52) U.S. Cl.
  CPC .............. *H04R 3/02* (2013.01); *B81B 3/0021* (2013.01); *B81B 2201/0257* (2013.01); *B81B 2203/019* (2013.01); *B81B 2203/0118* (2013.01); *B81B 2203/0127* (2013.01); *B81B 2203/0315* (2013.01); *H04R 2201/003* (2013.01)

(58) Field of Classification Search
  CPC .... H04R 25/606; H04R 17/005; H04R 23/02; H04R 2460/13; H04R 25/60; H04R 25/604; H04R 17/00
  See application file for complete search history.

(56) References Cited

U.S. PATENT DOCUMENTS

| | | | |
|---|---|---|---|
| 7,635,941 B2 * | 12/2009 | Bank | H04R 7/18 310/348 |
| 10,555,088 B2 * | 2/2020 | Meisel | H04R 19/005 |
| 11,237,090 B2 * | 2/2022 | Schneider | G01N 29/2437 |
| 2012/0267900 A1 * | 10/2012 | Huffman | H04R 1/265 290/1 R |

* cited by examiner

*Primary Examiner* — Amir H Etesam
(74) *Attorney, Agent, or Firm* — W&G Law Group

(57) ABSTRACT

A microelectromechanical system includes an enclosure defining a cavity and an opening communicating with the cavity; a membrane mounted at the opening; a cantilever located within the cavity, the at least one cantilever comprising a first end, a second end and a fulcrum located between the first end and the second end; a plunger positioned between the membrane and the cantilever and configured to transfer displacement of the membrane to the first end of the cantilever; and a sensing member connected to the second end of the cantilever. The distance between the first end and the fulcrum is less than that between the second end and the fulcrum. The microelectromechanical system has the advantages of high SNR, small package size and high sensitivity. The membrane has a stiffness order of magnitude higher than a conventional membrane, which avoids mechanical collapse and large DC deformation under 1 atm.

14 Claims, 4 Drawing Sheets

MICROELECTROMECHANICAL SYSTEM

FIELD OF THE INVENTION

The present disclosure relates to the field of electroacoustic transducers, and in particular, to a microelectromechanical system.

BACKGROUND

Conventional microelectromechanical system (MEMS) microphones usually comprise a back volume behind the membrane. The back volume is a semi-sealed volume of air that undergoes compression and expansion when there is an input acoustic wave. For a defined package size, the back volume is necessary to allow the membrane to move under external pressure wave. However, the back volume is currently the largest source of acoustic noise, which reduces the signal noise ratio (SNR) of the microphone. The smaller the back volume, the higher the acoustic noise generated by the back volume. It is therefore very difficult to make a microphone with SNR above approximately 74 dB unless the package size is made very large. However, very large package size is not feasible for mobile electronic devices.

The effective way of achieving very high SNR in a normal or smaller sized package is to make the back volume a vacuum. There is one significant challenge with such a type of vacuum back volume microphone. The pressure difference of 1atm between air and vacuum would collapse a normal membrane. Therefore, a very stiff membrane is needed. However, a very stiff membrane causes very low sensitivity. Conventional sensing designs would not work.

Therefore, it is desired to provide an improved MEMS which can at least partly overcome the above problems.

SUMMARY

In one aspect, the present disclosure provides a microelectromechanical system which comprises an enclosure defining a cavity and an opening communicating with the cavity; a membrane mounted at the opening; at least one cantilever located within the cavity, the at least one cantilever comprising a first end, a second end and a fulcrum located between the first end and the second end; a plunger positioned between the membrane and the at least one cantilever and configured to transfer displacement of the membrane to the first end of the at least one cantilever; and a sensing member connected to the second end of the at least one cantilever. The distance between the first end and the fulcrum is less than that between the second end and the fulcrum.

In some embodiments, the cavity is hermetically sealed, with an inside pressure less than an external atmosphere.

In some embodiments, the cavity is vacuum.

Preferably, the sensing member comprises a stationary part fixed with respect to the enclosure and a moveable part connected to the second end of the at least one cantilever and be moveable relative to the stationary part.

In some embodiments, the moveable part comprises a plurality of electrically conductive moveable fingers with a gap formed between every two adjacent moveable fingers; the stationary part comprises a plurality of electrically conductive stationary fingers with a gap formed between every two adjacent stationary fingers; and the moveable fingers are respectively aligned with the gaps of the stationary part and the stationary fingers are respectively aligned with the gaps of the moveable part.

In some embodiments, the at least one cantilever comprises a plurality of triangular-shaped or sector-shaped cantilevers arranged in a circular array.

In some embodiments, the at least one cantilever comprises a pair of rectangular cantilevers arranged in a linear array.

In some embodiments, the at least one cantilever further comprises a rib disposed at a surface thereof.

In some embodiments, the microelectromechanical system further comprises a support disposed between the fulcrum and the enclosure.

In some embodiments, the opening has a size less than that of the cavity.

In some embodiments, the at least one cantilever comprises multiple stages of cantilevers connected successively.

In some embodiments, the multiple stages of cantilevers comprises a first stage of cantilever, a second stage of cantilever and a third stage of cantilever, a first end of the first stage of cantilever is connected to the plunger, a second end of the first stage of cantilever is connected to a first end of the second stage of cantilever via another plunger, a second end of the second stage of cantilever is connected to a first end of the third stage of cantilever via further another plunger, and the moveable part of the sensing member is connected to a second end of the third stage of cantilever.

In some embodiments, every of the first stage of cantilever, second stage of cantilever and third stage of cantilever comprises a fulcrum located between the first end thereof and the second end thereof, and a support disposed between the fulcrum and the enclosure.

In some embodiments, the first end comprises a bending portion with a reduced thickness or one or more slits.

BRIEF DESCRIPTION OF THE DRAWINGS

In order to explain the technical solutions of the embodiments of the present disclosure more clearly, accompanying drawings used to describe the embodiments are briefly introduced below. It is evident that the drawings in the following description are only concerned with some embodiments of the present disclosure. For those skilled in the art, in a case where no inventive effort is made, other drawings may be obtained based on these drawings.

DESCRIPTION OF THE EMBODIMENTS

Figure 1:
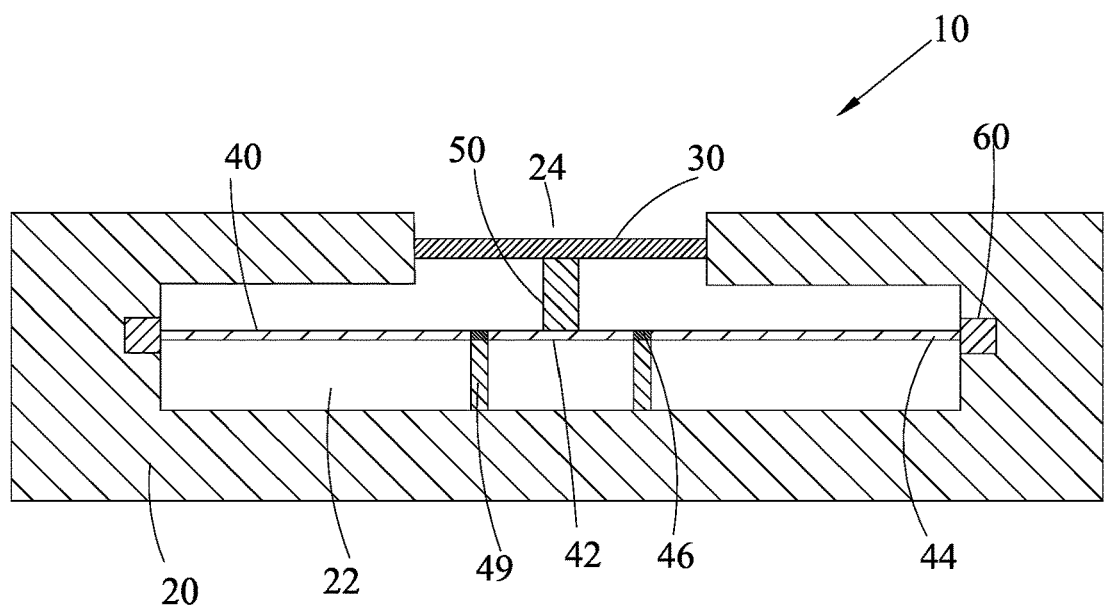
FIG. 1 is a cross sectional view of a microelectromechanical system in accordance with an exemplary embodiment of the present disclosure.

The present disclosure will be further illustrated with reference to the accompanying drawings. It shall be noted that the elements of similar structures or functions are represented by like reference numerals throughout the figures. The embodiments described herein are not intended as an exhaustive illustration or description of various other embodiments or as a limitation on the scope of the claims or the scope of some other embodiments that are apparent to one of ordinary skills in the art in view of the embodiments described in the Application. In addition, an illustrated embodiment need not have all the aspects or advantages shown.

Figure 2:
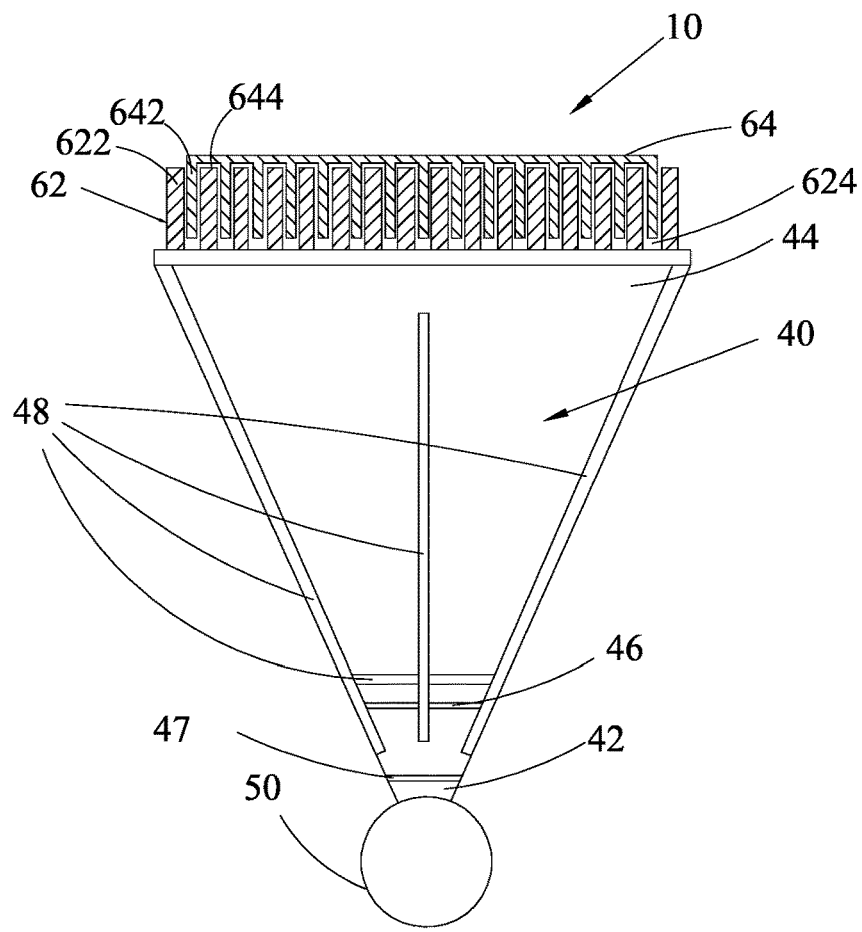
FIG. 2 is a schematic view of a cantilever of the microelectromechanical system in accordance with an exemplary embodiment of the present disclosure.

Referring to FIG. 1 and FIG. 2, a microelectromechanical system 10 comprises an enclosure 20 defining a cavity 22 and an opening 24 communicating with the cavity 22, a membrane 30 mounted at the opening 24, at least one cantilever 40 located within the cavity 22, and a plunger 50 positioned between the membrane 30 and the cantilevers 40.

In some embodiments, the cavity 22 enclosed by the enclosure and the membrane 30 is sealed to external atmosphere and vacuum. Alternatively, the pressure inside the cavity 22 can be in a reduced atmosphere, for example, 0.1 atmosphere pressure.

Each cantilever 40 comprises a first end 42, a second end 44 and a fulcrum 46 located between the first end 42 and the second end 44. One or more ribs 48 may be formed at a surface of the cantilever 40 facing the membrane 30 or opposite from the membrane 30 for increasing the stiffness of the cantilever 40. A support 49 is arranged between the fulcrum 46 and the enclosure 20 such that the cantilever 40 is pivotable about the fulcrum 46. The distance between the second end 44 and the fulcrum 46 is greater than the distance between the first end 42 and the fulcrum 46. In some embodiments, the distance between the second end 44 and the fulcrum 46 is equal to or greater than ten times of the distance between the first end 42 and the fulcrum 46. The hinged cantilever 40 is provided with a bending portion 47 at the first end 42 thereof. The bending portion 47 is created by forming a cutout/recess/slit at the bending portion to reduce the stiffness of that region, which facilitates bending of the cantilever 40 at the bending portion 47.

The first end 42 is connected to the plunger 50. The plunger 50 is configured to transfer displacement of the membrane 30 to the first end 42 of the cantilevers 40.

In some embodiments, the enclosure 20 is cylinder-shaped or polygon-shaped and a plurality of cantilevers 40 is arranged in a circular array. Each cantilever 40 has a triangular shape or sector shape. The first ends 42 are located at the center of the circular array of cantilevers 40 and the second ends 44 are located at the periphery of the circular array of cantilevers 40. The cantilevers 40 may be separately formed and arranged in a circular array with a gap formed between every two adjacent cantilevers 40. Alternatively, the cantilevers 40 are integrally formed as a single piece with a gap formed between every two adjacent cantilevers 40.

The microelectromechanical system 10 further comprises a sensing member 60. The sensing member 60 comprises a moveable part 62 connected to the second end 44 of the cantilever 40 and a stationary part 64 attached to the enclosure 20. The moveable part 62 comprises a plurality of spaced movable fingers 622 with gaps 624 formed there between and the stationary part 64 comprises a plurality of spaced stationary fingers 642 with gaps 644 formed there between. The movable fingers 622 are aligned with the gaps 644 of the stationary part 64 respectively and the stationary fingers 642 are aligned with the gaps 624 of the movable part 62 respectively. The fingers 622 and 642 may be made of conductive material or comprise conductive elements. Thus, the fingers 622 and 642 are electrically conductive and a capacitance is formed between the movable part 62 and the stationary part 64. The capacitance between the moveable part 62 and the stationary part 64 is based on the overlap of the moveable fingers 622 and the stationary fingers 624. For zero AC acoustic pressure wave applied to membrane 30, there is a fixed defined overlap between moveable finger 622 and stationary fingers 642 in the plane perpendicular to that shown in FIG. 2. When AC pressure is applied to the membrane 30, the moveable fingers 622 move in the direction perpendicular to the plane shown in FIG. 2, changing the amount of overlap with stationary fingers 642. The further that the moveable fingers 622 move away from the stationary fingers 642 in the direction perpendicular to the plane shown in FIG. 2, the lower the overlap with the gaps 624, and the lesser the capacitance. Similarly, the closer that the moveable fingers 622 move towards the stationary fingers 642 in the direction perpendicular to the plane shown in FIG. 2, the greater the capacitance. An electronic signal will be generated and output in response to change of the capacitance.

Figure 3:
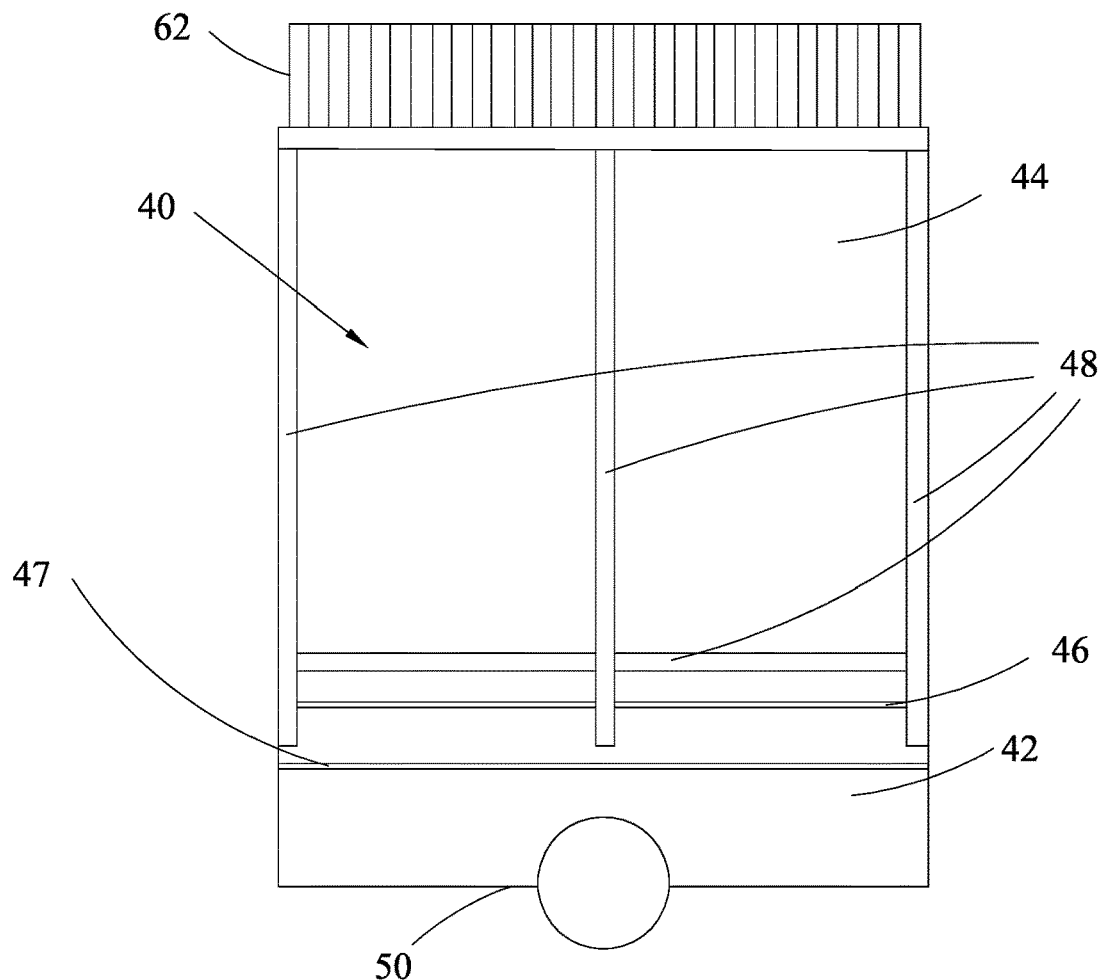
FIG. 3 is a schematic view of a cantilever of the microelectromechanical system in accordance with another exemplary embodiment of the present disclosure.

Referring to FIG. 3, alternatively, the cantilevers 40 are arranged in a linear array and each cantilever has a rectangular shape. For a linear array of rectangular cantilevers 40, each pair of cantilevers 40 can be attached to a single membrane 30.

Figure 4:
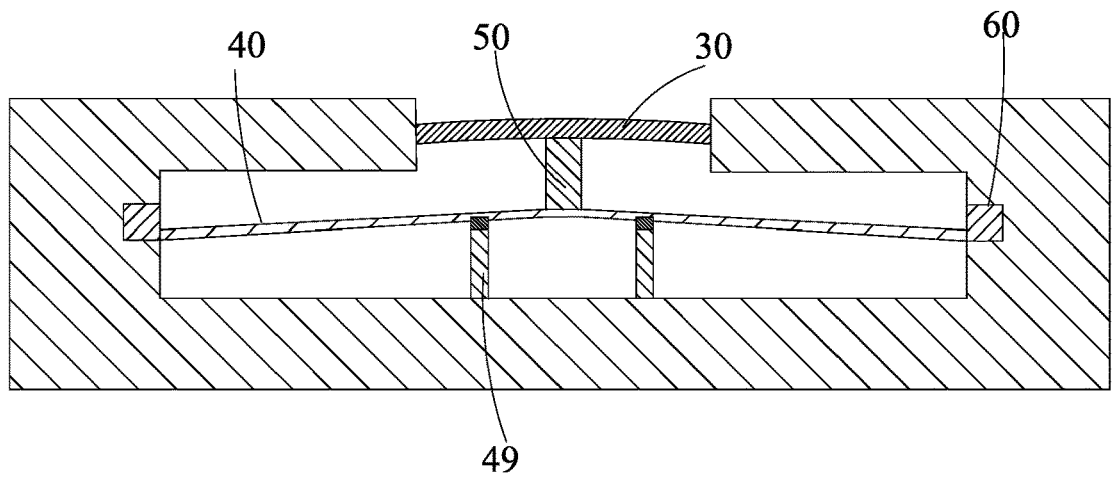
FIG. 4 is similar to FIG. 1 but showing the microelectromechanical system with a negative environmental pressure.
Figure 5:
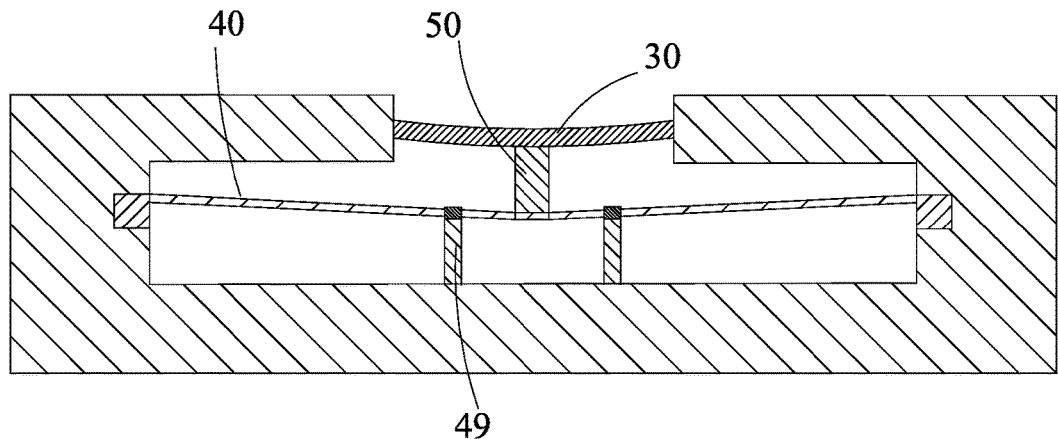
FIG. 5 is similar to FIG. 1 but showing the microelectromechanical system with a positive environmental pressure.

FIG. 4 and FIG. 5 illustrate deformation of the membrane 30 and the cantilevers 40 when the membrane 30 receives an AC sound wave entering the microphone. FIG. 4 illustrates deformation of the membrane 30 and the cantilevers 40 when a negative pressure is exerted on the membrane 30. FIG. 5 illustrates deformation of the membrane 30 and the cantilevers 40 when a positive pressure is exerted on the membrane 30. As shown in FIGS. 4 and FIG. 5, when the membrane 30 is displaced under a pressure difference between the inner surface and the outer surface of the membrane 30, the first ends 42 of the cantilevers 40 are pulled upwardly or pushed downwardly by the plunger 50, which results in the cantilevers 40 being pivoted about the fulcrums 46 and the second ends 44 of the cantilevers 40 together with the moveably parts 64 of the sensing member 60 being moved downwardly or upwardly to thereby change overlap between the moveable fingers 622 and the stationary fingers 642. As the distance between the second end 44 and the fulcrum 46 is much greater than the distance between the first end 42 and the fulcrum 46, the displacement of the membrane 30 is effectively amplified and the sensitivity of the microelectromechanical system 10 is increased.

Figure 6:
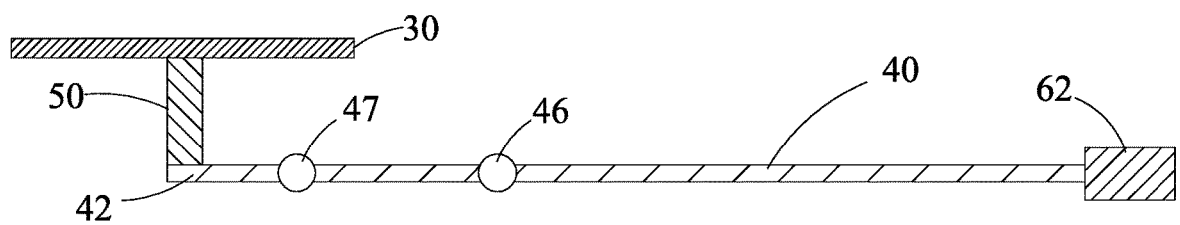
FIG. 6 and FIG. 7 are working principle diagrams of a hinged cantilever.
Figure 7:
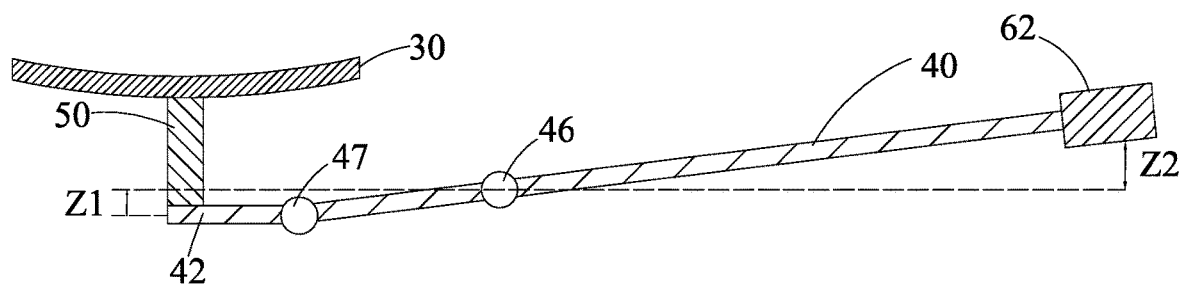

FIG. 6 and FIG. 7 illustrate the working principle of a hinged cantilever. Each hinged cantilever 40 made of a thin silicon plate has a bending point 47 created by slits formed therein, and a fulcrum 46 which is also created by slits in the same plate. The fulcrum 46 is next to the rigid ribs 48 which extend all the way out to the sensing area. As the cavity 22 is in a reduced atmosphere or vacuum and there is limited or no acoustics in the cavity, these ribs 48 are designed to be strong but light, with low inertia. When the membrane 30 is displaced by z1, the second end of the cantilever 40 together with the moveable part 62 of the sensing member is displaced in the opposite direction by z2 where z2 is greater than z1, therefore increasing the mechanical sensitivity of the microelectromechanical system 10 that applies the cantilever 40.

In the above-described embodiments, the size of the opening 24 is less than that of the cavity 22. Thus, the small diameter, thick membrane 30 which avoids mechanical collapse and very large DC deformation under 1atm, has a stiffness order of magnitude higher than a conventional membrane. The microelectromechanical system 10 applies the cantilevers 40 to amplify the displacement of the membrane 30 by at least a factor of approximately 10 or more, which is ideally suited to a perimeter based comb drive which can achieve enhanced electrostatic sensitivity. The hinged cantilevers 40 may be arranged in either a circular array in which case each cantilever 40 is triangular or sector or a linear array in which case each cantilever is rectangular. The first end 42 of each cantilever 40 is attached to the membrane 30 and the second end 44 is connected with the moveable part 62 of the sensing member 60. In general, there can be an array of membrane 30 all connected to a central plunger 50 which drives the array of hinged cantilevers 40. The cantilevers 40 could be attached to various electrostatic sensing members but a comb drive with spaced fingers is preferred due to high sensitivity and large allowed range of motion in the z direction for the moveable part 62 of the comb drive type sensing member 60.

To further increase mechanical sensitivity of the microelectromechanical system 10, a chain of cantilevers could be used with one stage of hinged cantilevers driving the next stage, resulting in higher amplification. This chain of cantilevers could be optimised to achieve a non-linear displacement amplification of the membrane such that the initial large DC displacement due to atmosphere is not amplified as much as displacements when the DC pressure is between 0.5-1 atm. This would be a type of passive DC position control.

Figure 8:
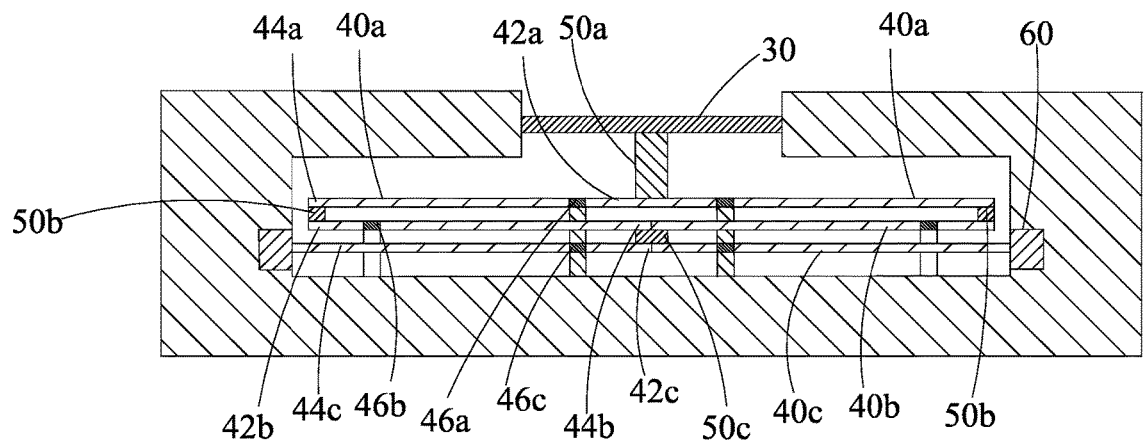
FIG. 8 and FIG. 9 illustrate a microelectromechanical system in accordance with another exemplary embodiment of the present disclosure.
Figure 9:
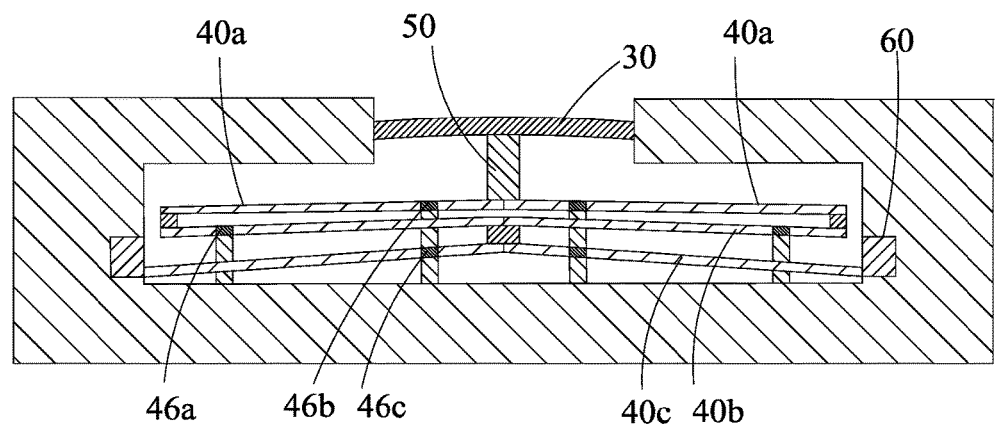

As shown in FIGS. 8-9, the microelectromechanical system 10 comprises a chain of cantilevers 40 connected successively. In this embodiment, the cantilevers 40 comprise first stage of cantilevers 40a, second stage of cantilevers 40b, and third stage of cantilevers 40c. The first ends 42a of the first stage of cantilevers 40a are connected to the first plunger 50a. The second ends 44a of the first stage of cantilevers 40a are connected to the first ends 42b of the second stage of cantilevers 40b via second plungers 50b and the second ends 44b of the second stage of cantilevers 40b are connected to the first ends 42c of the third stage of cantilevers 40c via third plungers 50c. The second ends 44c of the third stage of cantilevers 40c are connected to the moveable part 62 of the sensing member 60. The fulcrums 46a, 46b, 46c are respectively disposed between the first ends and the second ends of the cantilevers 40. The distance between the first ends 42a, 42b, 42c and the fulcrums 46a, 46b, 46c are respectively less than that between the second ends 44a, 44b, 44c and the fulcrums 46. Assume the distance between the second ends 44a and the fulcrums 46a is N1 times of the distance between the first ends 42a and the fulcrums 46a, the distance between the second ends 44b and the fulcrums 46b is N2 times of the distance between the first ends 42b and the fulcrums 46b, and the distance between the second ends 44c and the fulcrums 46c is N3 times of the distance between the first ends 42c and the fulcrums 46c, when the membrane 30 is displaced under a pressure difference between the inner surface and the outer surface of the membrane 30, the moveable part 62 of the sensing member 60 will achieve a displacement which is substantially N1*N2*N3 times of the displacement of the membrane 30. The displacement of the membrane 30 is greatly amplified.

The microelectromechanical system 10 according to the above disclosure has the advantage of high SNR, small package size and normal or high sensitivity. By also increasing mechanical sensitivity, a standard (−38 dB V/Pa) or higher total transducer sensitivity needed for a vacuum back volume design can be more easily reached. By making the cavity/back volume a vacuum, it does not need to be bigger than a conventional front volume and can be much smaller than that. This raises the possibility of a higher SNR microphone in a smaller package size than conventionally used, which is very attractive for all microphone applications, particularly mobile applications.

Although the invention is described with reference to one or more embodiments, the above description of the embodiments is used only to enable people skilled in the art to practice or use the invention. It should be appreciated by those skilled in the art that various modifications are possible without departing from the spirit or scope of the present invention. The embodiments illustrated above should not be interpreted as limits to the present invention, and the scope of the invention is to be determined by reference to the claims that follow.

What is claimed is:

1. A microelectromechanical system comprising:
    an enclosure defining a cavity and an opening communicating with the cavity;
    a membrane mounted at the opening;
    at least one cantilever located within the cavity, the at least one cantilever comprising a first end, a second end and a fulcrum located between the first end and the second end;
    a plunger positioned between the membrane and the at least one cantilever and configured to transfer displacement of the membrane to the first end of the at least one cantilever; and
    a sensing member connected to the second end of the at least one cantilever;
    wherein a distance between the first end and the fulcrum is less than that between the second end and the fulcrum;
    the sensing member comprises a stationary part fixed with respect to the enclosure and a moveable part connected to the second end of the at least one cantilever and be moveable relative to the stationary part.

2. The microelectromechanical system of claim 1, wherein the cavity is hermetically sealed, with an inside pressure less than an external atmosphere.

3. The microelectromechanical system of claim 2, wherein the cavity is vacuum.

4. The microelectromechanical system of claim 1, wherein the moveable part comprises a plurality of electrically conductive moveable fingers with a gap formed between every two adjacent moveable fingers;
    the stationary part comprises a plurality of electrically conductive stationary fingers with a gap formed between every two adjacent stationary fingers; and
    the moveable fingers are respectively aligned with the gaps of the stationary part and the stationary fingers are respectively aligned with the gaps of the moveable part.

5. The microelectromechanical system of claim 1, wherein the at least one cantilever comprises a plurality of triangular-shaped or sector-shaped cantilevers arranged in a circular array.

6. The microelectromechanical system of claim 1, wherein the at least one cantilever comprises a pair of rectangular cantilevers arranged in a linear array.

7. The microelectromechanical system of claim 1, wherein the at least one cantilever further comprises at least one rib disposed at a surface thereof.

8. The microelectromechanical system of claim 1, further comprising a support disposed between the fulcrum and the enclosure.

9. The microelectromechanical system of claim 1, wherein the opening has a size less than that of the cavity.

10. The microelectromechanical system of claim 1, wherein the at least one cantilever comprises multiple stages of cantilevers connected successively.

11. The microelectromechanical system of claim 10, wherein the multiple stages of cantilevers comprises a first stage of cantilever, a second stage of cantilever and a third stage of cantilever, a first end of the first stage of cantilever is connected to the plunger, a second end of the first stage of cantilever is connected to a first end of the second stage of cantilever via another plunger, a second end of the second stage of cantilever is connected to a first end of the third stage of cantilever via further another plunger, and the moveable part of the sensing member is connected to a second end of the third stage of cantilever.

12. The microelectromechanical system of claim 11, wherein every of the first stage of cantilever, second stage of cantilever and third stage of cantilever comprises a fulcrum located between the first end thereof and the second end thereof, and a support disposed between the fulcrum and the enclosure.

13. The microelectromechanical system of claim 1, wherein the first end comprises a bending portion with reduced thickness.

14. The microelectromechanical system of claim 1, wherein the first end comprises a bending portion with one or more slits.

* * * * *